United States Patent
Yamazaki et al.

(10) Patent No.: US 7,708,833 B2
(45) Date of Patent: May 4, 2010

(54) CRYSTAL GROWING APPARATUS

(75) Inventors: Shiro Yamazaki, Aichi-ken (JP); Koji Hirata, Aichi-ken (JP); Takayuki Sato, Aichi-ken (JP); Seiji Nagai, Aichi-ken (JP); Katsuhiro Imai, Nagoya (JP); Makoto Iwai, Nagoya (JP); Shuhei Higashihara, Nagoya (JP); Takatomo Sasaki, Minoo (JP); Yusuke Mori, 8-16-9, Kisaichi, Katano-shi, Osaka 576-0004 (JP); Fumio Kawamura, Minoo (JP)

(73) Assignees: Toyoda Gosei Co., Ltd., Aichi-ken (JP); NGK Insulators, Ltd., Aichi-ken (JP); Yusuke Mori, Osaka (JP)

( * ) Notice: Subject to any disclaimer, the term of this patent is extended or adjusted under 35 U.S.C. 154(b) by 44 days.

(21) Appl. No.: 12/073,904

(22) Filed: Mar. 11, 2008

(65) Prior Publication Data
US 2008/0223288 A1    Sep. 18, 2008

(30) Foreign Application Priority Data

Mar. 13, 2007  (JP)  ............................. 2007-062722
Feb. 8, 2008   (JP)  ............................. 2008-029035

(51) Int. Cl.
*C30B 35/00*   (2006.01)
(52) U.S. Cl. ....................... 117/200; 117/206; 117/900; 117/952
(58) Field of Classification Search ................. 117/200, 117/206, 900, 952
See application file for complete search history.

(56) References Cited

U.S. PATENT DOCUMENTS

| | | | |
|---|---|---|---|
| 7,459,023 B2 * | 12/2008 | Yamazaki et al. | ............. 117/81 |
| 2007/0101931 A1 * | 5/2007 | Yamazaki et al. | ........... 117/105 |
| 2008/0216737 A1 * | 9/2008 | Sarayama et al. | ........... 117/206 |
| 2008/0271665 A1 * | 11/2008 | Yamazaki et al. | ............. 117/13 |

FOREIGN PATENT DOCUMENTS

| JP | 2001-58900 | 3/2001 |
|---|---|---|
| JP | 2001-64097 | 3/2001 |
| JP | 2001-64098 | 3/2001 |
| JP | 2001-102316 | 4/2001 |
| JP | 2002-201100 | 7/2002 |
| JP | 2004-168650 | 6/2004 |
| JP | 2006-41458 | 2/2006 |

* cited by examiner

*Primary Examiner*—Felisa C Hiteshew
(74) *Attorney, Agent, or Firm*—McGinn Intellectual Property Law Group, PLLC

(57) ABSTRACT

An object of the invention is to carry out the flux method with improved work efficiency while maintaining the purity of flux at high level and saving flux material cost. The sodium-purifying apparatus includes a sodium-holding-and-management apparatus for maintaining purified sodium (Na) in a liquid state. Liquid sodium is supplied into a sodium-holding-and-management apparatus through a liquid-sodium supply piping maintained at 100° C. to 200° C. The sodium-holding-and-management apparatus further has an argon-gas-purifying apparatus for controlling the condition of argon (Ar) gas that fills the internal space thereof. Thus, by opening and closing a faucet at desired timing, purified liquid sodium (Na) supplied from the sodium-purifying apparatus can be introduced into a crucible as appropriate via the liquid-sodium supply piping, the sodium-holding-and-management apparatus, and the piping.

20 Claims, 1 Drawing Sheet

CRYSTAL GROWING APPARATUS

BACKGROUND OF THE INVENTION

1. Field of the Invention

The present invention relates to a crystal growing apparatus for growing a Group III nitride-based compound semiconductor crystal through the flux method.

2. Background Art

Conventionally known crystal growing apparatus and methods for growing Group III nitride-based compound semiconductor crystals through the flux method are disclosed in, for example, Japanese Patent Application Laid-Open (kokai) Nos. 2001-58900, 2001-64097, 2001-64098, 2001-102316, 2002-201100, 2004-168650, and 2006-041458.

Generally, when a Group III nitride-based compound semiconductor crystal is grown through the flux method, a crucible which contains a flux material is placed in an electric furnace, which serves as a crystal growing chamber of high temperature and high pressure. Then, a crystal growing process is started. In this connection, according to a most common, rational practice, a glove box is connected to an inlet of the electric furnace, and the crystal growth atmosphere in the electric furnace and the atmosphere in the glove box are integrally controlled so that the atmospheres have almost the same mixing ratio of gases at least when the furnace is opened.

According to a most commonly practiced procedure of working on a flux material, solid masses of sodium (Na) which have been highly purified are placed in the aforementioned glove box; after the internal atmosphere of the glove box is adjusted to predetermined conditions, oxidized surface layers of the solid masses of sodium (Na) are scraped off; and the thus-treated solid masses of sodium (Na) are placed in the aforementioned crucible, followed by start of crystal growth through the flux method. Thus, a knife must be used in the glove box for scraping off oxidized surface layers from the solid masses of sodium (Na).

In order to produce a semiconductor crystal having sufficiently good quality through the flux method, the purity of sodium (Na) used as a flux material is desirably at least 4N (99.99%), more desirably 6N or higher. Japanese Patent Application Laid-Open (kokai) No. 2006-041458 discloses an oxide-removing method different from the aforementioned scraping-off method. Specifically, solid masses of sodium (Na) are melted within the glove box through application of heat. Oxide and the like appearing on the surface of molten sodium (Na) are removed for purifying sodium (Na).

However, in the process of scraping off oxidized surface layers from the solid masses of sodium (Na), a small part of a knife is scraped, and the scrapings are mixed in the flux material, potentially resulting in a great drop in purity of flux. Also, this method increases in material cost with respect to sodium (Na), since a not small portion of a solid mass of sodium (Na) must be scraped off.

Furthermore, when, within the glove box, solid masses of sodium (Na) are formed into anglewise shapes as a result of scraping-off of oxide surface layers and are then placed in a crucible, the contained solid masses of sodium (Na) form a lot of interspace. This tends to lower the bulk ratio of the flux material to the volume of the crucible. Since improvement of the bulk ratio (i.e., reduction of the interspace within the crucible to a maximum extent to a maximum extent) requires a lot of time and effort, work efficiency is very hard to improve.

Meanwhile, a process of melting and purifying sodium (Na) within the glove box as described in, for example, Japanese Patent Application Laid-Open (kokai) No. 2006-041458 involves the following problems.

Problem 1: In the process of spooning up impurities appearing on the surface of molten liquid sodium (Na) by use of a spoon or the like, some portion of liquid sodium (Na) is unavoidably spooned up together with the impurities, thereby wasting the flux material.

Problem 2: Spooning up impurities stirs liquid sodium (Na) with a spoon or the like; consequently, some portion of impurities, such as oxide, is brought deep into liquid sodium (Na). Therefore, complete removal of impurities is difficult. Even in an attempt to remove only a surface layer of impurities by use of a suction device or the like, the same problem arises due to convection.

SUMMARY OF THE INVENTION

The present invention has been made in order to solve the aforementioned problems, and an object of the invention is to carry out the flux method with improved work efficiency while maintaining the purity of flux at high level and saving flux material cost.

In order to solve the aforementioned problems, the following means are effective.

As the first aspect of the invention, the present invention provides a crystal growing apparatus for growing a Group III nitride-based compound semiconductor crystal through the flux method by use of at least sodium (Na) as a flux material, the apparatus comprising:

a high-temperature, high-pressure furnace for growing a Group III nitride-based compound semiconductor crystal;

a glove box which is connected to an inlet of the high-temperature, high-pressure furnace; and a sodium-purifying apparatus connected to the glove box and adapted to supply into the glove box purified liquid sodium (Na) in a state isolated from the ambient atmosphere, wherein the glove box is isolated from the ambient atmosphere, and at least when the inlet is opened, the glove box is maintained such that the internal atmosphere thereof has the same gas component mixing ratio as that of the internal atmosphere of the high-temperature, high-pressure furnace.

The sodium-purifying apparatus used in the first aspect of the invention may employ any sodium (Na) purifying process, so long as the sodium-purifying apparatus can supply purified liquid sodium (Na).

As the second aspect of the invention, the present invention provides a crystal growing apparatus according to the first means, wherein the sodium-purifying apparatus is equipped with a sodium-holding-and-management apparatus for maintaining purified sodium (Na) in a liquid state.

As the third aspect of the invention, the present invention provides a crystal growing apparatus according to the second aspect of the invention, wherein the sodium-holding-and-management apparatus comprises a dehumidifier for maintaining an internal humidity of the sodium-holding-and-management apparatus which holds purified liquid sodium (Na) at a predetermined dew-point humidity or lower, and an oxygen-removing apparatus for maintaining an internal oxygen concentration of the sodium-holding-and-management apparatus at a predetermined level or lower.

Specifically, for example, in the case where liquid sodium (Na) is maintained in an argon gas atmosphere of about 1 atm (about 0.1 MPa), desirably, the humidity is maintained at that at a dew point of $-100°$ C. or lower, and the oxygen concentration is maintained at 0.1 ppm or less.

As the fourth aspect of the invention, the present invention provides a crystal growing apparatus according to any one of the first to third aspect of the invention, wherein liquid sodium (Na) is withdrawn from a central portion of liquid sodium (Na) held in a sodium-maintaining container of the sodium-holding-and-management apparatus.

As the fifth aspect of the invention, the present invention provides a crystal growing apparatus according to any one of the first to fourth aspect of the invention, wherein the glove box is provided with a faucet disposed therein for allowing or shutting off, as appropriate, inflow of purified liquid sodium (Na) supplied from the sodium-purifying apparatus.

As the sixth aspect of the invention, the present invention provides a crystal growing apparatus according to any one of the first to fifth aspect of the invention, wherein a member for holding or transporting liquid sodium (Na) are formed from pure aluminum.

As the seventh aspect of the invention, the present invention provides a crystal growing apparatus according to any one of the first to sixth aspect of the invention, wherein liquid sodium (Na) has a temperature of 100° C. to 200° C.

As the eighth aspect of the invention, the present invention provides a crystal growing apparatus according to any one of the first to sixth aspect of the invention, wherein liquid sodium (Na) has a temperature of 120° C. to 150° C.

The above means can solve the aforementioned problems effectively or rationally.

According to the first aspect of the invention, purified liquid sodium (Na) of high purity can be supplied into the glove box from the sodium-purifying apparatus in a closed environment isolated from the ambient atmosphere. This avoids oxidation of the surface of sodium (Na), which could otherwise be caused by oxygen and water vapor contained in the ambient atmosphere, thereby eliminating need to scrape off a surface layer from sodium (Na).

Thus, the first aspect of the invention can yield the following effects.

Effect 1: Liquid sodium (Na) of high purity can be produced directly and efficiently in the glove box.

Effect 2: Since wasteful formation of scrapings including removed oxide and the like from sodium (Na) is not involved, flux material cost can be saved.

Effect 3: Since the bulk ratio of the flux material to the volume of the crucible readily and naturally increases, manual labor for increasing the bulk ratio can be eliminated. This drastically improves work efficiency.

According to the second aspect of the invention, liquid sodium (Na) can be supplied into the glove box at any timing asynchronous with the sodium-purifying process of the sodium-purifying apparatus.

The third aspect of the invention ensures prevention of oxidation of liquid sodium (Na) held in the sodium-holding-and-management apparatus, which oxidation would otherwise be caused by water vapor or oxygen.

According to the fourth aspect of the invention, liquid sodium (Na) is withdrawn from a central portion of liquid sodium (Na) held in the sodium-holding container of the sodium-holding-and-management apparatus. Thus, even when oxide floats on a gas-liquid interface (surface of molten liquid sodium) or adheres to holding members, the oxide is not mixed in liquid sodium that is introduced into a crucible. As a result, liquid sodium of high purity can be charged into the high-temperature, high-pressure furnace, whereby the purity of growing crystal can be improved.

According to the fifth aspect of the invention, the faucet is disposed within the glove box. Thus, when a worker is engaged in manual work in the glove box, the worker can open and close the faucet without need to unglove. As compared with the case where a cock or an on-off valve is provided on the outside of the glove box, work can be done more accurately, and work efficiency improves.

According to the sixth aspect of the invention, pure aluminum is used to form the container for holding purified liquid sodium, and piping for transporting purified liquid sodium. On the basis of the inventors' findings, pure aluminum is not wetted at all with liquid sodium and, aluminum and liquid sodium are phase-separated from each other. By virtue of this characteristic, by means of forming the container and piping from pure aluminum, there can be prevented a problem of dissolution, in liquid sodium, of component elements of a material used to form the container and piping. Therefore, the purity of liquid sodium can be improved; as a result, the purity of growing crystal can be improved.

According to the seventh aspect of the invention, liquid sodium is held or transported at a preferred temperature of 100° C. to 200° C. According to the eighth aspect of the invention, liquid sodium is held or transported at a more preferred temperature of 120° C. to 150° C. When the temperature of liquid sodium is too low, temperature variation may cause liquid sodium to be solidified in a certain portion of piping. When the temperature of liquid sodium is too high, the durability of apparatus members deteriorates, and, for example, an expensive valve resistant to high temperature must be employed.

DESCRIPTION OF THE PREFERRED EMBODIMENT

Figure 1:
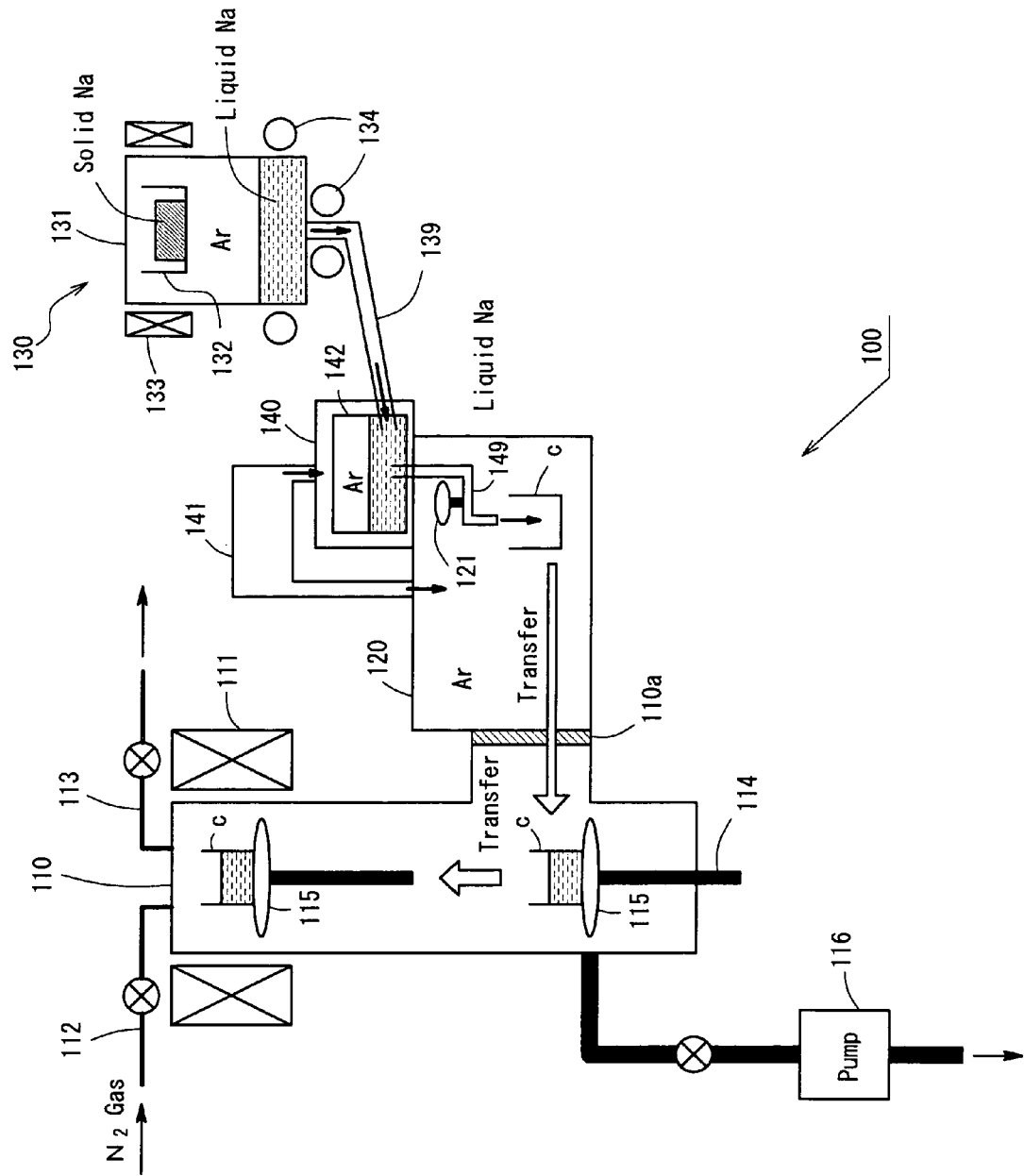
FIG. 1 is a theoretical configuration diagram of a crystal growing apparatus of Embodiment 1 of the invention.

Desirably, in execution of crystal growth through the flux method, the high-temperature, high-pressure furnace (reaction chamber) can be controllably increased and decreased in temperature, as appropriate, in a temperature range from ambient temperature to about 1,000° C. Also, desirably, the reaction chamber can be controllably increased and decreased in pressure, as appropriate, in the pressure range from 0 atm to about 100 atm (about $1.0 \times 10^7$ Pa). Furthermore, desirably, stainless steels (SUS) and alumina-based materials, for example, are used to form an electric furnace, a crucible, a material gas tank, gas piping, etc., which constitute the crystal growing apparatus.

Generally, when a liquid alkali metal is protected by inert gas, rare gas such as argon, helium, neon, or xenon, is used. Other than rare gas, nitrogen gas, which is inexpensive, may be used. However, since lithium (Li) reacts with nitrogen gas, in the case of use of a flux mixture which contains lithium, rare gas is recommended for use in protecting the flux mixture.

Any method may be employed for producing a seed crystal and a base substrate for use in crystal growth through the flux method. Specifically, for example, the flux method, HVPE, MOVPE, and MBE are effectively employed. A seed crystal and a base substrate may have any size or thickness. However, in view of industrial practicability, desirably, a seed crystal and a base substrate assume a circular shape having a diameter of about 45 mm or a square shape of about 27 mm or 13 mm. The greater the radius of curvature of the face of a seed crystal or a base substrate on which crystal grows, the more desirable.

An embodiment of the present invention will next be described with reference to the drawing.

However, the present invention is not limited to the embodiment described below.

Embodiment 1

FIG. 1 shows a theoretical configuration of a crystal growing apparatus 100 of Embodiment 1. The crystal growing apparatus 100 is adapted to grow a Group III nitride-based compound semiconductor crystal through the flux method that uses at least sodium (Na) as a flux material. The crystal growing apparatus 100 includes a high-temperature, high-pressure furnace 110 (reaction chamber) for growing a Group III nitride-based compound semiconductor crystal; a glove box 120, which is connected to the inlet of the high-temperature, high-pressure furnace 110 and whose interior is isolated from the ambient atmosphere; and a sodium-purifying apparatus 130 connected to the glove box 120 and adapted to supply into the glove box 120 purified liquid sodium (Na) in a condition isolated from the ambient atmosphere.

The sodium-purifying apparatus 130 includes a closed container 131 of stainless steel; a tray 132 for holding solid or liquid sodium (Na); a heater 133 for heating the solid or liquid sodium (Na); a cooling device 134 for cooling gaseous and liquid sodium (Na) to a temperature of about 100° C.; and a liquid-sodium supply piping 139 for discharging liquid sodium (Na). The tray 132 is fixed within the closed container 131. For example, commercially available solid sodium (Na) purified to about 4N (99.99%) is placed in a required amount in the tray 132. The closed container 131 is sufficiently evacuated; subsequently, the closed container 131 can be filled with argon (Ar) gas of about one atmosphere (about 0.1 MPa). Then, sodium (Na) is distilled by use of the heater 133 for heating sodium (Na) contained in the tray 132 and the cooling device 134 for cooling sodium (Na) contained in the closed container 131 to a temperature of about 100° C., whereby sodium (Na) can be purified to a high purity of 6N (99.9999%) or higher. Herein, sodium (Na) is heated to such a temperature that sodium (Na) can be distilled (e.g., 650° C. or higher).

The sodium-purifying apparatus 130 is equipped with a sodium-holding-and-management apparatus 140 for maintaining purified sodium (Na) in a liquid state. The sodium-holding-and-management apparatus 140 has a sodium-holding container 142. Liquid sodium is supplied into the sodium-holding container 142 through the liquid-sodium supply piping 139, which is maintained at 100° C. to 200° C. Liquid sodium held in the sodium-holding container 142 is also maintained at 100° C. to 200° C. Furthermore, the sodium-holding-and-management apparatus 140 has an argon-gas-purifying apparatus 141 for managing the condition of argon (Ar) gas that fills the internal space of the sodium-holding-and-management apparatus 140. The argon-gas-purifying apparatus 141 is also connected to the glove box 120 and thus can control in an integrated manner the condition of argon (Ar) gas that fills the glove box 120 and the condition of argon (Ar) gas that fills the sodium-holding-and-management apparatus 140. The argon-gas-purifying apparatus 141 includes a dehumidifier for maintaining at a predetermined dew-point humidity or lower the humidity of argon gas that fills the internal space of the sodium-holding-and-management apparatus 140 and the internal space of the glove box 120, and an oxygen-removing apparatus for maintaining the oxygen concentration of the filling argon gas at a predetermined level or lower. Thus, argon gas that fills the internal space of the sodium-holding-and-management apparatus 140, and argon gas that fills the internal space of the glove box 120 can be maintained, for example, at a pressure of about one atmosphere (about 0.1 MPa), at about 100° C. to 200° C., at a humidity at that at a dew point of −100° C. or lower, and at an oxygen concentration of 0.1 ppm or lower.

The sodium-holding-and-management apparatus 140 has piping 149, which extends from the sodium-holding container 142 to the interior of the glove box 120. A faucet 121 is provided in the piping 149. The piping 149 and the faucet 121 are also maintained at 100° C. to 200° C. Thus, by opening and closing the faucet 121 at desired timing, purified liquid sodium (Na) supplied from the sodium-purifying apparatus 130 can be introduced into a crucible c as appropriate via the liquid-sodium supply piping 139, the sodium-holding-and-management apparatus 140, the sodium-holding container 142, and the piping 149. The liquid sodium introduced into the crucible c is also maintained accordingly at 100° C. to 200° C. After being purified to high purity in the sodium-purifying apparatus 130, sodium (Na) is completely isolated from the ambient atmosphere, and, in the sodium-holding-and-management apparatus 140 and the glove box 120, sodium (Na) is protected by argon gas whose dew-point humidity and oxygen concentration are very low.

Meanwhile, pure aluminum is used to form the piping 149, the sodium-holding container 142 in the sodium-holding-and-management apparatus 140, and the liquid-sodium supply piping 139. The inventor of the present invention, et al. have found the following: since pure aluminum is not wetted at all with liquid sodium and is phase-separated from liquid sodium, impurities are unlikely to be dissolved into liquid sodium, and, thus, pure aluminum can be preferably used.

An open end of the liquid-sodium supply piping 139 and that of the piping 149 are not in contact with the bottom of the sodium-holding container 142, but project into a central portion of liquid sodium held in the sodium-holding container 142, for the following reason. Even in a controlled atmosphere, molten metallic sodium is highly likely to be oxidized, and oxide is apt to float on a gas-liquid interface (surface of molten liquid sodium) and to adhere to liquid-sodium-holding members, such as a container and piping. The above-mentioned configurational feature of the pipe ends can avoid contamination of liquid sodium by such oxide.

The temperature of liquid sodium and that of the container and piping in contact with liquid sodium are preferably 100° C. to 200° C., more preferably 120° C. to 150° C. When the temperature is too low, temperature variation may cause liquid sodium to be solidified in a certain portion of piping. When the temperature is too high, the durability of apparatus members deteriorates, and, for example, an expensive valve resistant to high temperature must be employed.

The glove box 120 has a sufficient internal space for accommodating a closed container in which an additive is contained, a seed substrate, and various tools such as a balance. Thus, the mass of liquid sodium introduced into the crucible c through the faucet 121 and the mass of lithium (Li) or the like added to the liquid sodium can be accurately weighed within the glove box 120.

The high-temperature, high-pressure furnace 110 and the glove box 120 are connected together in such a manner that their interiors are isolated from the ambient atmosphere, and a gate valve 110a is provided at their connection; i.e., at the inlet of the high-temperature, high-pressure furnace 110, for allowing and shutting off communication therebetween. Thus, at least when the inlet is opened, the internal atmosphere of the high-temperature, high-pressure furnace 110 and that of the glove box 120 are maintained at the same mixing ratio of gases.

Components (Na, Li, etc.) of a flux material are prepared in respectively predetermined amounts by accurate weighing and are placed in the crucible c that contains an unillustrated seed substrate on which crystal is grown. Subsequently, while being held via the gloves of the glove box 120, the crucible c is transferred through the inlet and is then placed on a plate 115.

After the gate valve 110a of the high-temperature, high-pressure furnace 110 is closed, a pump 116 evacuates argon gas from the high-temperature, high-pressure furnace 110. In parallel with the evacuating operation, a plate-lifting device 114 conveys the plate 115 loaded with the crucible c up to the level of a heater 111. Nitrogen gas ($N_2$) necessary for crystal growth is supplied through a nitrogen gas supply piping 112. Reference numeral 113 denotes evacuation piping for evacuating nitrogen gas.

The high-temperature, high-pressure furnace 110 can be controllably increased and decreased in temperature, as appropriate, in the temperature range from ambient temperature to about 1,000° C. by means of a heater 111. Also, the reaction chamber (high-temperature, high-pressure furnace 110) can be controllably increased and decreased in pressure (pressure of nitrogen gas), as appropriate, in the pressure range from 0 atm to about 100 atm (about $1.0 \times 10^7$ Pa).

The above-described apparatus configuration can grow a desired semiconductor crystal on the seed substrate (growth substrate) through the flux method. Also, the apparatus configuration allows the flux method to be carried out with improved work efficiency while maintaining the purity of employed flux (i.e., sodium (Na)) at high level and saving material cost.

Modifications

The present invention is not limited to the above embodiment, but may be modified in various other forms as exemplified below. Even those modifications can yield the effects of the present invention by means of the operations of the present invention.

Modification 1

In Modification 1, the sodium-purifying apparatus 130 of Embodiment 1 described above purifies sodium (Na) by distillation. However, the sodium-purifying apparatus of the present invention may employ any other purifying process. Specifically, any means capable of supplying purified liquid sodium (Na) of high purity into the glove box can be used as purifying means (sodium-purifying apparatus) of the crystal growing apparatus of the present invention.

Modification 2

The structure of the high-temperature, high-pressure furnace of the crystal growing apparatus of the present invention is not limited to the structure of the crystal growing apparatus 100 of Embodiment 1 described above. For example, the high-temperature, high-pressure furnace 110 may not be provided with the plate-lifting device 114. Specifically, any known control system as disclosed in, for example, Japanese Patent Application Laid-Open (kokai) Nos. 2001-58900, 2001-64097, 2001-64098, 2001-102316, 2002-201100, 2004-168650, and 2006-041458 may be applied to or applied in a modified fashion to the structure of the high-temperature, high-pressure furnace of the crystal growing apparatus of the present invention.

Also, no particular limitation is imposed on a method of producing a Group III nitride-based compound semiconductor crystal associated with use of the crystal growing apparatus of the present invention. The crystal growing apparatus of the present invention can employ any crystal growing method that is carried out according to a known flux method while using sodium as flux.

The crystal growing apparatus of the present invention can be applied to production, by use of Na flux, of a bulk crystal of a Group III nitride-based compound semiconductor, such as a gallium nitride (GaN) semiconductor. Therefore, the present invention is useful for, for example, producing semiconductor devices from Group III nitride-based compound semiconductor crystals. Examples of such semiconductor devices include light-emitting devices and photoreceptors, such as LEDs and LDs, and other general semiconductor devices, such as FETs.

What is claimed is:

1. A crystal growing apparatus for growing a Group III nitride-based compound semiconductor crystal through a flux method by use of at least sodium (Na) as a flux material, the apparatus comprising:
   a high-temperature, high-pressure furnace for growing the Group III nitride-based compound semiconductor crystal;
   a glove box which is connected to an inlet of the high-temperature, high-pressure furnace; and
   a sodium-purifying apparatus connected to the glove box and adapted to supply into the glove box purified liquid sodium (Na) in a state isolated from an ambient atmosphere,
   wherein the glove box is isolated from the ambient atmosphere, and
   wherein at least when the inlet is opened, the glove box has an internal atmosphere with a gas component mixing ratio equal to a gas component mixing ratio of an internal atmosphere of the high-temperature, high-pressure furnace.

2. The crystal growing apparatus as described in claim 1, wherein the sodium-purifying apparatus comprises a sodium-holding-and-management apparatus for maintaining purified sodium (Na) in a liquid state.

3. The crystal growing apparatus as described in claim 2, wherein the sodium-holding-and-management apparatus comprises:
   a dehumidifier for maintaining an internal humidity of the sodium-holding-and-management apparatus at a predetermined dew-point humidity or lower; and
   an oxygen-removing apparatus for maintaining an internal oxygen concentration of the sodium-holding-and-management apparatus at a predetermined level or lower, and
   wherein the sodium-holding-and-management apparatus holds purified liquid sodium (Na).

4. The crystal growing apparatus according to claim 2, wherein the sodium-holding-and-management apparatus comprises a sodium-maintaining container for holding a central portion of liquid sodium (Na) from which liquid sodium (Na) is withdrawn.

5. The crystal growing apparatus according to claim 3, wherein the sodium-holding-and-management apparatus comprises a sodium-maintaining container for holding a central portion of liquid sodium (Na) is from which liquid sodium (Na) is withdrawn.

6. The crystal growing apparatus according to claim 1, wherein the glove box comprises a faucet for allowing or shutting off, as appropriate, an inflow of purified liquid sodium (Na) from the sodium-purifying apparatus.

7. The crystal growing apparatus according to claim 4, wherein the glove box comprises a faucet for allowing or shutting off, as appropriate, an inflow of purified liquid sodium (Na) from the sodium-purifying apparatus.

8. The crystal growing apparatus according to claim 1, further comprising a member for holding or transporting liquid sodium (Na), the member being formed from pure aluminum.

9. The crystal growing apparatus according to claim 2, further comprising wherein a member for holding or transporting liquid sodium (Na), the member being formed from pure aluminum.

10. The crystal growing apparatus according to claim 6, further comprising a member for holding or transporting liquid sodium (Na), the member being formed from pure aluminum.

11. The crystal growing apparatus according to claim 7, further comprising a member for holding or transporting liquid sodium (Na), the member being formed from pure aluminum.

12. The crystal growing apparatus according to claim 1, wherein liquid sodium (Na) has a temperature in a range of 100° C. to 200° C.

13. The crystal growing apparatus according to claim 2, wherein liquid sodium (Na) has a temperature in a range of 100° C. to 200° C.

14. The crystal growing apparatus according to claim 6, wherein liquid sodium (Na) has a temperature in a range of 100° C. to 200° C.

15. The crystal growing apparatus according to claim 7, wherein liquid sodium (Na) has a temperature in a range of 100° C. to 200° C.

16. The crystal growing apparatus according to claim 1, wherein liquid sodium (Na) has a temperature in a range of 120° C. to 150° C.

17. The crystal growing apparatus according to claim 2, wherein liquid sodium (Na) has a temperature in a range of 120° C. to 150° C.

18. The crystal growing apparatus according to claim 6, wherein liquid sodium (Na) has a temperature in a range of 120° C. to 150° C.

19. The crystal growing apparatus according to claim 7, wherein liquid sodium (Na) has a temperature in a range of 120° C. to 150° C.

20. The crystal growing apparatus according to claim 1, wherein the glove box comprises a crucible for receiving the purified liquid sodium (Na) from the sodium-purifying apparatus, and wherein the sodium-purifying apparatus comprises liquid-sodium supply piping for pouring the purified liquid sodium (Na) into the crucible.

* * * * *

UNITED STATES PATENT AND TRADEMARK OFFICE
CERTIFICATE OF CORRECTION

PATENT NO. : 7,708,833 B2
APPLICATION NO. : 12/073904
DATED : May 4, 2010
INVENTOR(S) : Shiro Yamazaki et al.

It is certified that error appears in the above-identified patent and that said Letters Patent is hereby corrected as shown below:

Claim 9, Column 9, Line 6
 further comprising ~~wherein~~ a member

Claim 12, Column 9, Line 19
 100° C[[.]] to 200° C.

Claim 13, Column 9, Line 22
 100° C[[.]] to 200° C.

Claim 14, Column 9, Line 25
 100° C[[.]] to 200° C.

Claim 15, Column 10, Line 3
 100° C[[.]] to 200° C.

Claim 16, Column 10, Line 6
 120° C[[.]] to 150° C.

Claim 17, Column 10, Line 9
 120° C[[.]] to 150° C.

Claim 18, Column 10, Line 12
 120° C[[.]] to 150° C.

Claim 19, Column 10, Line 15
 120° C[[.]] to 150° C.

Signed and Sealed this

Twentieth Day of July, 2010

David J. Kappos
*Director of the United States Patent and Trademark Office*